(12) United States Patent
Miyamoto

(10) Patent No.: US 8,142,597 B2
(45) Date of Patent: Mar. 27, 2012

(54) METHOD FOR MANUFACTURING A PRINTED-WIRING BOARD HAVING A RESISTIVE ELEMENT

(75) Inventor: Garo Miyamoto, Ushiku (JP)

(73) Assignee: Nippon Mektron, Ltd., Tokyo-To (JP)

( * ) Notice: Subject to any disclaimer, the term of this patent is extended or adjusted under 35 U.S.C. 154(b) by 0 days.

(21) Appl. No.: 12/232,467

(22) Filed: Sep. 17, 2008

(65) Prior Publication Data

US 2009/0071599 A1   Mar. 19, 2009

(30) Foreign Application Priority Data

Sep. 19, 2007   (JP) ................... 2007-241978

(51) Int. Cl.
*B29C 65/00* (2006.01)
(52) U.S. Cl. ........................ 156/250; 156/256
(58) Field of Classification Search .............. 156/250, 156/256
See application file for complete search history.

(56) References Cited

U.S. PATENT DOCUMENTS 5,243,320 A * 9/1993 Clouser et al. ............... 338/308

FOREIGN PATENT DOCUMENTS

| JP | 03-171692 | 7/1991 |
| JP | 2000-174405 | 6/2000 |
| JP | 2004-335827 | 11/2004 |
| JP | 2006-156746 | 6/2006 |
| JP | 2006-222110 | 8/2006 |
| JP | 2006-228781 | 8/2006 |
| JP | 2006-237446 | 9/2006 |

OTHER PUBLICATIONS

English translation of JP 2004-335827 A.*

* cited by examiner

*Primary Examiner* — Philip Tucker
*Assistant Examiner* — Nickolas Harm
(74) *Attorney, Agent, or Firm* — Jacobson Holman PLLC

(57) ABSTRACT

A method for manufacturing a printed-wiring board having an organic resin insulating layer and a metal wiring layer and having a film-like resistive element formed on the metal wiring layer thereof, the method including: disposing a metal wiring layer on one surface of one organic resin insulating layer 1 to form an organic resin printed-wiring board 4; forming a pair of electrodes 5 on the metal wiring layer of the organic resin printed-wiring board; forming a film-like resistive element 7 between the electrodes; applying a temperature and a pressure of a laminating press to the side of the metal wiring layer in the wiring board without use of a laminating adhesive agent to change a resistance value of the film-like resistive element; trimming the film-like resistive element for adjusting a resistance value; providing a circuit member 12 having at least one layer of insulating layer; and laminating the circuit member with a laminating adhesive agent 13 in between so as to contact with a layer of the organic resin printer-circuit board having the film-like resistive element formed thereon. Accordingly, the present invention provides a method for manufacturing a printed-wiring board with built-in resistive element formed by resistive paste with high accuracy and high yield at low cost.

2 Claims, 3 Drawing Sheets

METHOD FOR MANUFACTURING A PRINTED-WIRING BOARD HAVING A RESISTIVE ELEMENT

CROSS REFERENCE TO RELATED APPLICATIONS

This application is based upon and claims the benefit of priority from the prior Japanese Patent Application No. 2007-241978, filed on Sep. 19, 2007, the entire contents of which are incorporated herein by reference.

BACKGROUND OF THE INVENTION

1. Field of the Invention

The present invention relates to a method for manufacturing a printed-wiring board and, in particular, to a method for manufacturing a printed-wiring board having a resistive element therein.

2. Related Art

In recent years, with miniaturization and high functionality of an electronic device, the mounting density of components has remarkably increased. Accordingly, a printed-wiring board having built-in components with increased mounting density has been studied, in which passive components are formed on an inner surface of the printed-wiring board, which will replace a conventional method: soldering passive components such as resistors and capacitors on a printed-wiring board in a chip-component form.

A method of forming resistors of passive components on an inner surface of a printed-wiring board has been conventionally put to practical use through a ceramic multilayer printed-wiring board. However, because a resistor is formed by screen printing, the resistor has various resistance values. After firing of a resistor, a desired resistance value must be obtained by trimming the resistor with laser or sand-blasting it. The firing temperature is high, above 500° C. and cannot be applied to an organic resin printed-wiring board.

Moreover, as a trial to an organic resin printed-wiring board, there have been studied a method for forming a resistive thin film on the whole surface and obtaining a desired resistance value by etching and a method for applying low-temperature fired resistive paste by screen printing to obtain a desired resistance value. The resistors formed on inner surfaces of the printed-wiring boards are applicable to required wide variety of resistance values, and few variations in resistance value, that is, high accuracy in preparing a resistor pattern and a uniform resistive film thickness are required.

The above-described thin-film method can achieve high resistor pattern accuracy; however, the range of an obtained resistance value is narrow because of a thin film. On the other hand, a resistive paste method provides wide variety of resistance values; however, it is inferior in accuracy of a resistor pattern formed by screen printing and uniformity of film thickness. Accordingly, the resistive paste method requires laser trimming to increase accuracy of a resistance value.

It has been known that the resistors formed by the resistive paste method suffer from the resistance value changes, when undergoing laminating press in order to incorporate them in a printed-wiring board. A variation in the resistance value varies depending upon laminating conditions, type of laminating adhesive agent or film thickness and size of a resistive paste and therefore is difficult to previously estimate the variation of the resistance value due to laminating press before trimming and obtain a desired resistance value after lamination.

The printed-wiring board with built-in resistive element disclosed in Japanese Patent Laid-Open No. 2006-222110 (refer to [0006] at page 3) prevents a variation in a resistance value under high temperature and humidity by forming a substitution type non-electrolytic silver plating film between resistive paste and an electrode. However, the method cannot suppress a variation in a resistance value due to lamination.

Moreover, the printed-wiring board with built-in resistive element disclosed in Japanese Patent Laid-Open No. 2004-335827 (refer to [0012] at page 3 to [0013] at page 4) has improved a trimming method for resistance value adjustment and can adjust the resistance value to a lower or higher one. However, an adjustment method cannot be determined until a resistance value has been measured, which causes a troublesome process. Further, no consideration is given to a change in a resistance value due to a laminating process after adjustment of the resistance value.

The printed-wiring board with built-in resistive element disclosed in Japanese Patent Laid-Open No. 2000-174405 (refer to [0011] at page 2) can make the printed-wiring board itself serve as a spacer to restrain variations in resistance values due to laminating because a through hole is filled with resistive paste. However, simply filling the hole with paste cannot create a highly accurate resistance value and therefore there occurs such a structure that resistance value adjustment cannot be made even by laser trimming.

In the printed-wiring board with built-in resistive element disclosed in Japanese Patent Laid-Open No. 2006-228781 (refer to [0005] at page 3), a resistor is heated by laser with lowered power, when trimming to adjust a resistance value, to change the resistance value and subsequently to perform trimming processing with increased power.

However, to heat the resistor, the whole area of the resistor must be scanned with weak laser beams and therefore it takes much time. Variations in resistance value at laminating are not caused simply by heating and there is an influence of laminating pressure. This method cannot complete variations in resistance value.

In the printed-wiring board with built-in resistive element disclosed in Japanese Patent Laid-Open No. 2006-156746 (refer to [0020] at page 5), a nickel alloy thin film is formed between resistive paste and an electrode to prevent variations in resistance value under high temperature and humidity. However, the method cannot restrain variations in resistance value due to laminating.

FIG. 2 is a sectional view illustrating a method for manufacturing a printed-wiring board with built-in resistive element using resistive paste disclosed in Japanese Patent Laid-Open No. 2006-156746, where there is prepared a double-sided copper-clad laminate 31 having a first and a second conductive layers of copper foil or the like on both sides of an insulating base material such as polyimide to form a through-hole at a required position by drill processing or laser processing.

Subsequently, a plating film is formed by conductive processing and a circuit pattern is formed using an etching process by usual photo-fabrication to obtain a double-sided printed-wiring board 32.

Next, a nickel alloy thin film 33 is formed on an electrode portion in contact with resistive paste and a resistor 34 by the resistive paste is formed by screen printing between the electrodes covered with the nickel alloy thin film 33. Next, a resistance value of the resistor 34 is adjusted by forming a removed portion by laser trimming or the like.

Subsequently, four-layer structure is formed by laminating copper foil 36 with resin or the like. Subsequently, a bottomed via-hole for performing inter-layer conduction is formed by laser and plating coating is formed by conductive processing. Subsequently, a circuit pattern is formed using an etching process by photo fabrication, thus obtaining a printed-wiring board 37 with built-in resistive element.

A terminal resistor of a transmission line or EMI filter resistor needs a technique of inexpensively creating resistance value accuracy of ±1 or less, in a built-in state on a printed-wiring board.

However, a conventional built-in resistive element formed by resistive paste cannot accommodate resistance changes before and after lamination and therefore it is difficult to perform high-yield manufacture with accuracy of ±1 or less, in a built-in state.

SUMMARY OF THE INVENTION

In view of the foregoing problems, it is an object of the present invention to provide a method for manufacturing a printed-wiring board with built-in resistive element formed by resistive paste with high accuracy and high yield at low cost.

To achieve the above object, according to the present invention, there is provided a method for manufacturing a printed-wiring board having an organic resin insulating layer and a metal wiring layer and having a film-like resistive element formed on the metal wiring layer thereof, the method including:

disposing a metal wiring layer on one surface of one organic resin insulating layer to form an organic resin printed-wiring board;

forming a pair of electrodes on the metal wiring layer of the organic resin printed-wiring board;

forming a film-like resistive element between the electrodes;

applying a temperature and a pressure of a laminating press to the side of the metal wiring layer in the wiring board without use of a laminating adhesive agent to change a resistance value of the film-like resistive element;

trimming the film-like resistive element for adjusting a resistance value;

providing a circuit member having at least one layer of insulating layer; and laminating the circuit member with a laminating adhesive agent in between so as to contact with a layer of the organic resin printer-circuit board having the film-like resistive element formed thereon.

The present invention adjusts a resistance value by performing required trimming for a resistive element which has previously completed resistance changes by applying a lamination history and therefore a changing amount of resistance value after trimming is very small, thus a resistor with high resistance value accuracy can be manufactured with high yield at low cost. Accordingly, a printed-wiring board with built-in resistive element requiring high accuracy, such as a terminal resistor of a transmission line or EMI filter resistor, can be manufactured at low cost and high stability.

DETAILED DESCRIPTION OF THE INVENTION

Figure 1A:
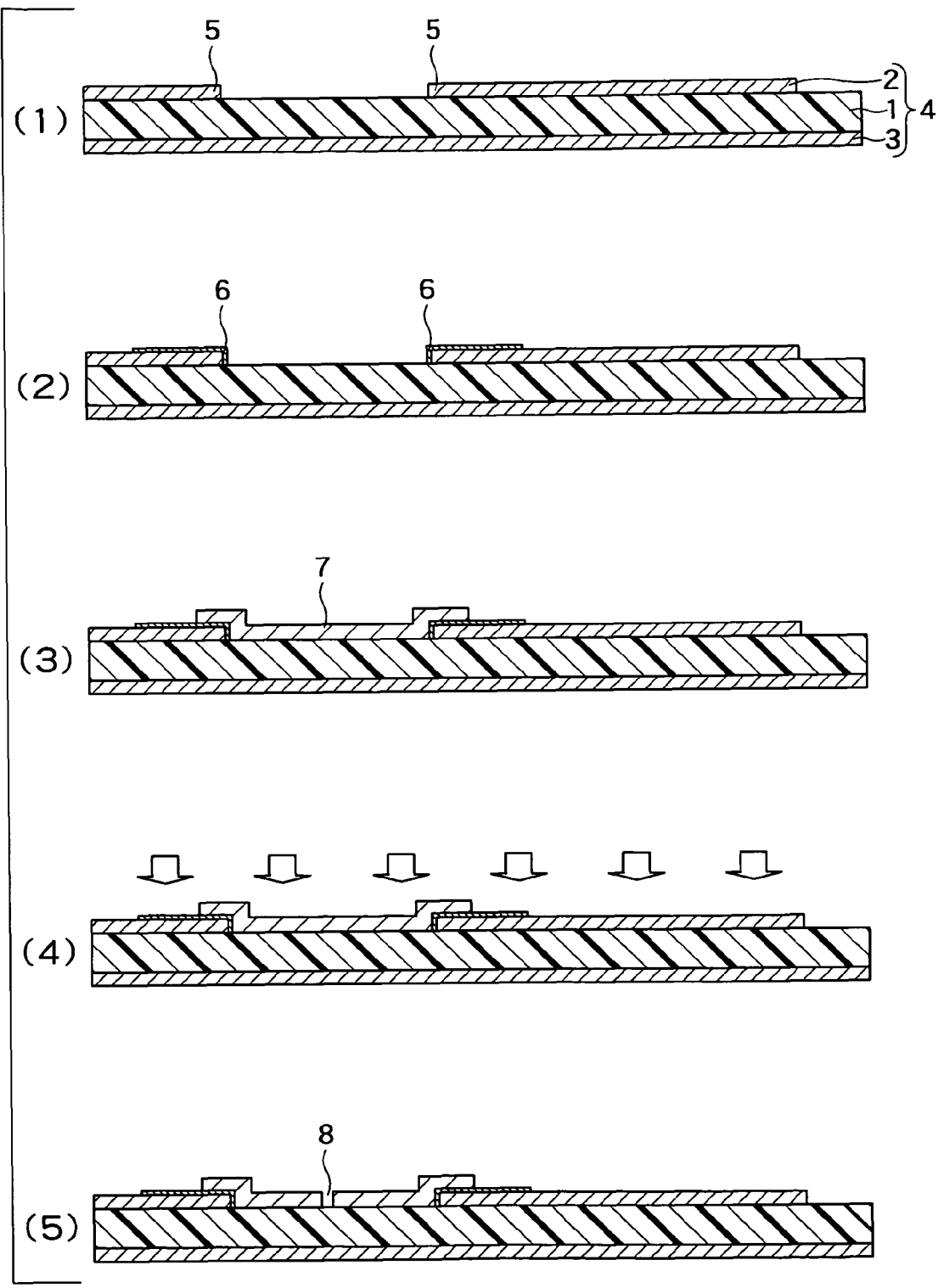
FIG. 1A is a manufacturing process view of a printed-wiring board with built-in resistive element according to one embodiment of the present invention.
Figure 1B:
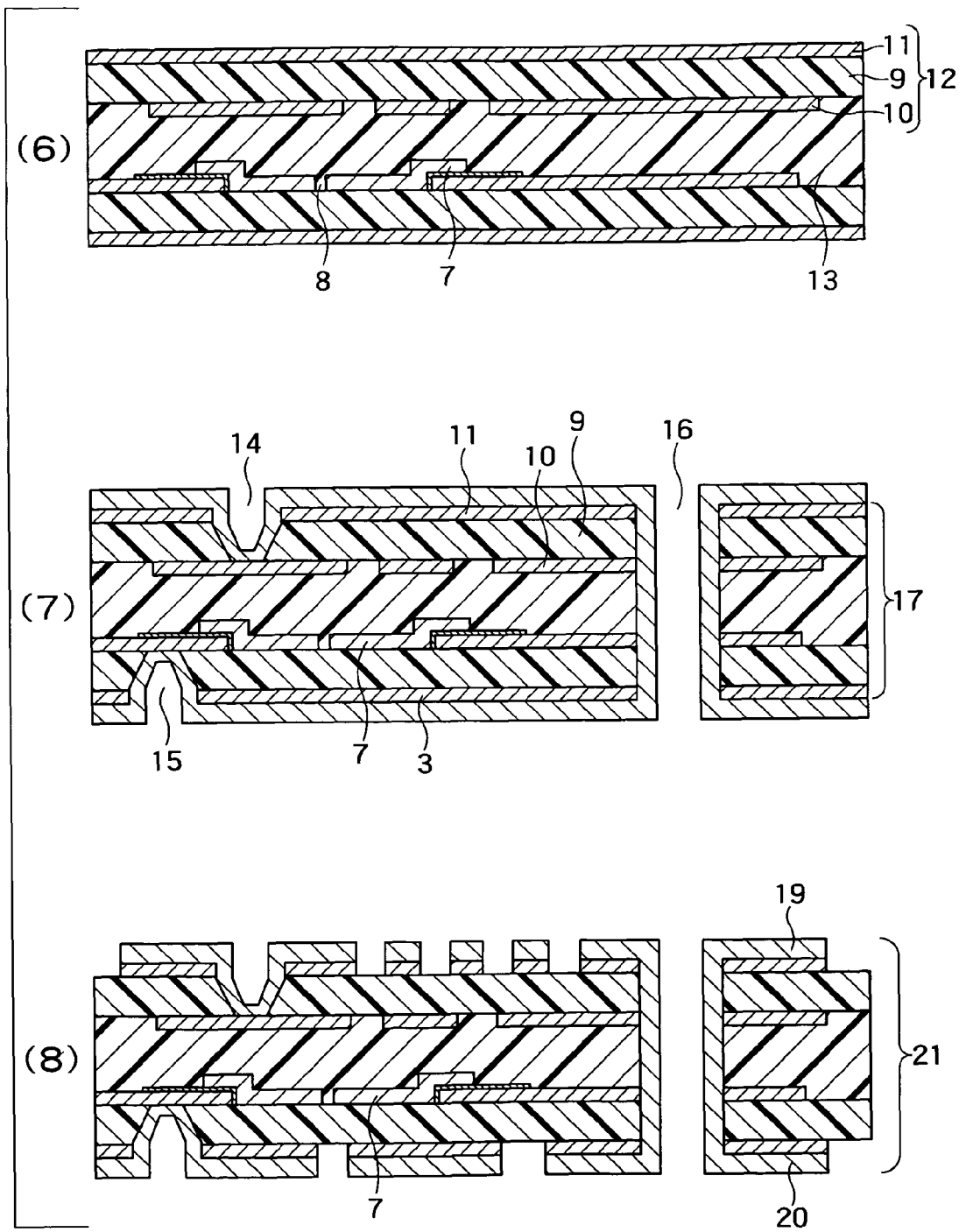
FIG. 1B is a manufacturing process view subsequent to FIG. 1A.
Figure 2:
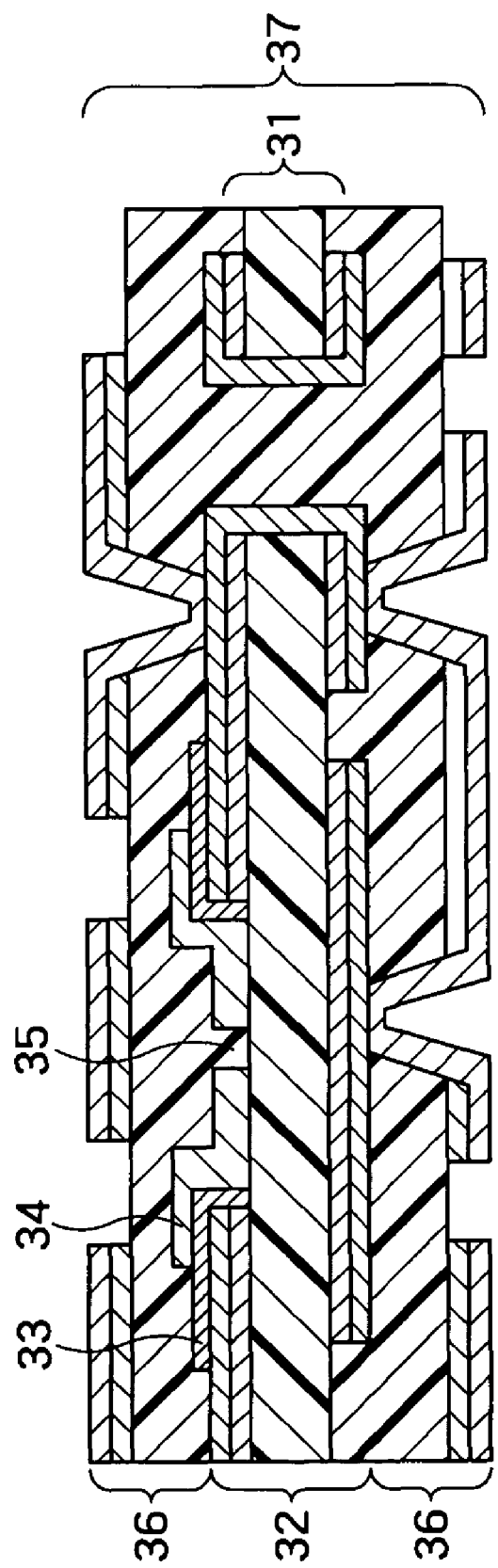
FIG. 2 is a sectional view of a printer-wiring board with built-in resistive element by a conventional method.

Referring now to FIGS. 1A and 1B, the embodiment of the present invention will be described below.

First Embodiment

FIGS. 1A and 1B are a sectional process view illustrating a method for manufacturing a printed-wiring board with built-in resistive element according to one embodiment of the present invention.

First, as illustrated in FIG. 1A(1), there is prepared a double-sided copper-clad laminate 4 as an organic resin printed-wiring board having a first metal foil 2 such as copper foil and a second metal foil 3 on both faces of an insulating base material 1 such as polyimide as an organic resin insulating layer. At a required position of the first metal foil 2, an electrode 5 for resistor formation is provided, using an etching process by usual photo fabrication and concurrently a circuit is formed.

For the insulating base material 1, 25 μm thick polyimide was used and, for metal foils 2, 3, 12 μm thick electrolytic copper foil was used. The resistance value is determined according to width and film thickness of resistive paste, electrode-to-electrode distance and a sheet resistance value of resistive paste. In the present embodiment, the electrode-to-electrode distance was 1.0 mm.

Next, as illustrated in FIG. 1A(2), to form an electrode portion 6 to be in contact with a resistor, surface treatment of electroless Ag plating was performed. The plating thickness was approximately 0.2 μm. This was performed in order to suppress a resistance change in high-temperature and high-humidity test. Further, it has been verified that noble metal plating such as Ni plating or Au plating, or Ag paste printing also provides the same advantage.

In the present embodiment, partial plating was performed to the electrode portion 6, and dry film HY-920 made of Asahi Kasei was used as the mask. Dry film used herein can be replaced with other type of dry film, provided that the film is of acid resisting type.

As illustrated in FIG. 1A(3), a resistor 7 was formed at the electrode portion 6 with resistive paste by a printing method and was thermally hardened. Resistive paste having sheet resistance value of 50Ω of TU-50-8 made of Asahi Kaken was used. As a formation method, screen printing method was used, but the formation may be made by another method such as dispenser or ink jet.

As a screen plate, plain weave stainless screen plate having specifications of 400 mesh number and 10 μm in emulsion thickness was used. Thermal hardening was performed with a box type hot-air oven at 170° C. and for one hour.

Subsequently, as illustrated in FIG. 1A(4), temperature and pressure (laminating history) higher than those of a laminating press were applied to a resistor 7 through a mold releasing film using a vacuum laminator to change the resistance value of the resistor 7. Lamination used herein was made at a temperature of 200° C. and a pressure of 4.0 Mpa for 10 minutes. In applying the laminating history, preferably, a cushion material is inserted into between the press and a resistor.

Use of highly rigid plate made of, for example, SUS applies only local pressure and therefore satisfactory results cannot be achieved. Preferably, the cushion material used as the measures has an elastic modulus of less than 2 GPa at normal temperature. In Embodiment 1, TPX made by Mitsui Chemical which also functions as a mold releasing film was used.

The condition of the laminating history requires that temperature and pressure are higher than the laminating condition and oven cure condition of laminating adhesive agent. An applicable temperature range is 150° C. to 350° C., a pressure range id 2 MPa to 10 MPa and press time is 1 to 60 minutes and conditions are selected, depending upon laminating adhesive agent used.

Next, as illustrated in FIG. 1A(5), a removed portion 8 is formed at a resistor 7 by trimming using YAG laser and such adjustment as to increase a resistance value of the resistor 7 was made under resistance measurement. As the laser used herein, use of other laser beam source such as $YVO_4$ laser provides the same advantages.

Next, as illustrated in FIG. 1B(6), lamination was made through a laminating adhesive agent 13 so that a circuit formation surface of the circuit member 12 having a circuit formed using an etching process by usual photo fabrication at a required position of the first metal foil 10 and a surface at which the resistor 7 is formed come into contact with the so-called double-sided copper-clad laminate 12 having the first metal foil 10 such as copper foil and the second metal foil 11 on both faces of the insulating base material 9 such as polyimide. Laminating conditions were as follows: 170° C., 2.0 MPa and 4-min press with a vacuum laminator and 180° C. and 2.5-hour oven cure with box-type hot air oven.

As illustrated in FIG. 1B(7), after bottomed via-holes 14, 15 for inter-layer conduction and a through hole 16 were formed using laser processing or drill processing, desmear processing and conductive processing for the substrate 17 were performed, and plating film 18 were formed.

As illustrated in FIG. 1B(8), circuit patterns 19, 20 were formed using an etching process by photo fabrication for the second metal foils 3, 11 and the plating film 18, thereby achieving a printed-wiring board 21 with built-in resistive element having resistance value accuracy of ±1% or less. In the embodiment described above, as the circuit member, the double-sided copper-clad laminate was used, but single-sided copper-clad laminate or cover film provides the same advantages.

Using a method according to the present invention, a built-in resistive element can be formed with resistance value accuracy of ±1 or less and high yield because a laminating history is previously applied and a resistance value is adjusted by trimming under a completed state of resistance value variation instead of implementing lamination after a variation in resistance value due to lamination is estimated, a variation in resistance value due to lamination is offset in advance to adjust a resistance value of a resistor.

What is claimed is:

1. A method for manufacturing a printed-circuit board having an organic resin insulating layer and a metal wiring layer and having a film-like resistive element formed on the metal wiring layer thereof, the method comprising the steps in the following order:

disposing a metal wiring layer on one surface of one organic resin insulating layer to form an organic resin printed-circuit board;

forming a pair of electrodes on the metal wiring layer of the organic resin printed-circuit board;

forming a film-like resistive element between the electrodes with resistive paste by a printing method such that the resistive paste overlaps the electrodes;

applying a temperature and a pressure of a laminating press to the side of the metal wiring layer in the printed-circuit board without use of a laminating adhesive agent to change a resistance value of the film-like resistive element;

trimming the film-like resistive element for adjusting the resistance value thereof;

providing a circuit member having at least one layer of insulating layer; and laminating the circuit member with a layer of the organic resin printed-circuit board having the film-like resistive element formed thereon, inserting a laminating adhesive agent between the circuit member and the layer of the organic resin printed-circuit board.

2. The method for manufacturing a printed-circuit board according to claim 1, wherein the temperature, pressure and time of the laminating press applied without use of laminating adhesive agent is above those in laminating the circuit member using a laminating adhesive agent.

* * * * *